US008881966B2

(12) United States Patent
Misumi et al.

(10) Patent No.: US 8,881,966 B2
(45) Date of Patent: Nov. 11, 2014

(54) METHOD OF MANUFACTURING SEMICONDUCTOR DEVICE, AND WIRE BONDER

(75) Inventors: Kazuyuki Misumi, Tokyo (JP); Hideyuki Arakawa, Tokyo (JP); Shunji Yamauchi, Tokyo (JP); Mitsuru Aoki, Tokyo (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 954 days.

(21) Appl. No.: 12/633,830

(22) Filed: Dec. 9, 2009

(65) Prior Publication Data
US 2010/0203681 A1 Aug. 12, 2010

(30) Foreign Application Priority Data

Feb. 6, 2009 (JP) ................................ 2009-025686

(51) Int. Cl.
| | | |
|---|---|---|
| B23K 37/00 | (2006.01) | |
| B23K 37/02 | (2006.01) | |
| B23K 37/04 | (2006.01) | |
| B23K 31/00 | (2006.01) | |
| H01L 23/00 | (2006.01) | |

(52) U.S. Cl.
CPC ....... *H01L 24/85* (2013.01); *H01L 2924/01015* (2013.01); *H01L 2224/7865* (2013.01); *H01L 2924/01006* (2013.01); *H01L 2924/014* (2013.01); *H01L 2224/48227* (2013.01); *H01L 24/78* (2013.01); *H01L 2224/78301* (2013.01); *H01L 2924/01079* (2013.01); *H01L 2224/78703* (2013.01); *H01L 2224/48465* (2013.01); *H01L 2924/15311* (2013.01); *H01L 24/97* (2013.01); *H01L 2224/7825* (2013.01); *H01L 2224/45147* (2013.01); *H01L 2224/73265* (2013.01); *H01L 2924/01047* (2013.01); *H01L 2924/14* (2013.01); *H01L 2924/01004* (2013.01); *H01L 2224/45015* (2013.01); *H01L 2224/45144* (2013.01); *H01L 2924/01029* (2013.01); *H01L 2224/32225* (2013.01); *H01L 2924/01082* (2013.01); *H01L 24/45* (2013.01); *H01L 2224/85181* (2013.01); *H01L 2924/01033* (2013.01); *H01L 2224/48091* (2013.01); *H01L 2924/01005* (2013.01); *H01L 24/48* (2013.01); *H01L 2224/48247* (2013.01); *H01L 2924/20752* (2013.01); *Y10S 228/904* (2013.01)
USPC .......................... 228/180.5; 228/4.5; 228/904

(58) Field of Classification Search
USPC ........................................ 228/180.5, 4.5, 904
See application file for complete search history.

(56) References Cited

U.S. PATENT DOCUMENTS

| | | | | |
|---|---|---|---|---|
| 4,765,531 A | * | 8/1988 | Ricketson et al. | .......... 228/180.5 |
| 5,186,719 A | * | 2/1993 | Egashira et al. | ............. 29/25.01 |

(Continued)

FOREIGN PATENT DOCUMENTS

| | | |
|---|---|---|
| JP | 01-198038 | 8/1989 |
| JP | 02-065148 A | 3/1990 |

(Continued)

OTHER PUBLICATIONS

Office Action issued Nov. 6, 2012, in Japanese Patent Application No. 2009-025686.
Office Action issued Apr. 23, 2013, in Japanese Patent Application No. 2009-025686.

(Continued)

*Primary Examiner* — Erin Saad
(74) *Attorney, Agent, or Firm* — Miles & Stockbridge P.C.

(57) ABSTRACT

An improvement in the quality of wire bonding is achieved by reducing the vibration of a lead frame or a wiring substrate after wire bonding. Over a heat block in a wire bond portion of a wire bonder, there is provided a cooling blower for cooling a wire-bonded matrix frame so that the temperature thereof may decrease stepwise. After wire bonding, cold air is blown from the cooling blower to the matrix frame, and temperature control of the matrix frame is performed so that the temperature of the matrix frame after wire bonding may decrease stepwise. Or, the wire-bonded matrix frame is fixed with a holding tool such as a frame holding member, a guide member, a roller means, or an elastic means until cooling is completed.

19 Claims, 17 Drawing Sheets

(56) References Cited

U.S. PATENT DOCUMENTS

| | | | | |
|---|---|---|---|---|
| 5,307,978 | A | * | 5/1994 | Ricketson et al. ............ 228/4.5 |
| 6,071,759 | A | * | 6/2000 | Sugita et al. ................. 438/118 |
| 6,111,311 | A | * | 8/2000 | Suzuki .......................... 257/691 |
| 6,229,221 | B1 | * | 5/2001 | Kloen et al. .................. 257/784 |
| 2006/0016860 | A1 | * | 1/2006 | Kampschreur et al. .... 228/180.5 |
| 2006/0022331 | A1 | * | 2/2006 | Shinohara .................... 257/718 |
| 2007/0095280 | A1 | * | 5/2007 | Schrock et al. .............. 118/503 |

FOREIGN PATENT DOCUMENTS

| | | |
|---|---|---|
| JP | 06-326149 A | 11/1994 |
| JP | 2001-110840 A | 4/2001 |

OTHER PUBLICATIONS

Office Action dated Apr. 1, 2014 for Japanese Application No. 2013-151750, with English language translation.

Office Action issued Sep. 4, 2013, in Chinese Patent Application No. 200910263609.7.

* cited by examiner

METHOD OF MANUFACTURING SEMICONDUCTOR DEVICE, AND WIRE BONDER

CROSS-REFERENCE TO RELATED APPLICATION

The disclosure of Japanese Patent Application No. 2009-25686 filed on Feb. 6, 2009 including the specification, drawings and abstract is incorporated herein by reference in its entirety.

BACKGROUND OF THE INVENTION

The present invention relates to techniques for manufacturing semiconductor devices, and in particular, relates to the technique effectively applied in reducing the vibration of a lead frame in a wire bonding process.

Japanese patent laid-open No. 2001-110840 describes a technique, wherein during wire bonding, a wire connection portion between a semiconductor chip and its mounting member is efficiently heated and after wire connection a wire-connected member is cooled in a short time.

SUMMARY OF THE INVENTION

In a wire bonder that electrically connects an electrode pad of a semiconductor chip and an inner lead of a lead frame with a wire such as a gold wire, wire bonding is performed with the inner lead being pressed by a frame holding member so that the inner lead may not flap, over a heat block where the wire bonding is performed.

In the above-described wire bonder, wire bonding is performed over the heat block with the lead frame heated to approximately 230 to 240° C., and thereafter the lead frame is released after the frame holding member goes up. When the lead frame is released, the strip-like lead frame will bend (deform) so as to project upward with respect to the width direction due to thermal shrinkage. Under this state, the lead frame is fed to a rear stage of a wire bond portion in the lead frame feeding direction in the wire bonder. Since the heat block is not present at the rear stage of the wire bond portion, abrupt cooling starts in a device region of the lead frame in which a semiconductor chip is mounted. The present inventors have found that the lead frame then flaps, i.e., vibrates because a portion deformed (elongated) by heating tends to return to the original state due to the abrupt cooling.

The present inventors found in particular that the wire is swung and deformed by the vibration (flap) of the inner lead.

Furthermore, in cases where the wire is a gold wire, if a reduction in the wire diameter is attempted for reducing the cost, and the wire results in a wire with the diameter equal to or less than 20 μm, for example, there arises a problem that the deformation of the wire noticeably appears due to the vibration of the inner lead and consequently a short-circuit between wires, a short-circuit between a wire and a chip, or the like occurs.

As a result of studying the causes of the vibration of the lead frame, the present inventors have found the following causes.

A first cause is considered to be thermal shrinkage when the inner lead elongated by heat is abruptly cooled to return to the original state, and is considered to be the vibration caused by this thermal shrinkage.

Furthermore, a second cause is considered to be a difference at each location in the stress, which is caused by a dispersion of temperature changes due to a difference in the heat radiation paths of the respective inner leads when the inner leads are abruptly cooled, and the vibration is considered to be caused by the difference at each location in this stress.

Also in cases where the wire bonding technique set forth in Japanese patent laid-open No. 2001-110840 is used, a wire connection portion between a semiconductor chip and its mounting member is heated during wire bonding, and after wire connection the wire-connected member is abruptly cooled in a short time. Thus, after wire bonding, the device region is quenched, which is considered to cause vibration of the lead frame (inner lead) and in turn cause the deformation of wires.

The present invention has been made in view of the above circumstances and provides a technique capable of achieving an improvement in the quality of wire bonding.

It is another object of the present invention to provide a technique capable of achieving an improvement in the reliability of wire bonding.

The other purposes and the new feature of the present invention will become clear from the description of the present specification and the accompanying drawings.

The following explains briefly the outline of a typical invention among the inventions disclosed in the present application.

That is, according to an aspect of the present invention, a method of manufacturing a semiconductor chip comprises the steps of: (a) preparing a lead frame, wherein a plurality of device regions, in each of which a semiconductor chip is mounted, are formed side by side and wherein a plurality of leads are provided in the respective device regions; (b) mounting the semiconductor chip in the device regions of the lead frame; (c) disposing the lead frame over a heat block of a wire bonder, and wire bonding the semiconductor chip mounted in the device region and the leads, with the leads being pressed by a frame holding member; and (d) after the step (c), cooling the lead frame so that the temperature thereof may decrease stepwise.

According to another aspect of the present invention, a method of manufacturing a semiconductor chip comprises the steps of: (a) preparing a lead frame, wherein a plurality of device regions, in each of which a semiconductor chip is mounted, are formed side by side and wherein a plurality of leads are provided in the respective device regions; (b) mounting the semiconductor chip in the device regions of the lead frame; (c) disposing the lead frame over a heat block of a wire bonder, and wire bonding the semiconductor chip mounted in the device region and the leads, with the leads being pressed by a frame holding member; and (d) after the step (c), pressing a rear stage portion of the frame holding member in a feeding direction of the lead frame.

According to yet another aspect of the present invention, there is provided a wire bonder for wire bonding a semiconductor chip, and a plurality of leads provided in a device region of a lead frame in which the semiconductor chip is mounted, the wire bonder comprising: a heat block for supporting the lead frame in which the device regions are formed side by side and also for heating the lead frame during wire bonding; a frame holding member for pressing the leads of the lead frame disposed over the heat block; a capillary for guiding a wire, the capillary serving as a bonding tool for wire bonding; and a guide member that is disposed so as to contact with an outside of the device regions of the lead frame along a longitudinal direction of the lead frame on both front and back surface sides of the lead frame over the heat block.

According to yet another aspect of the present invention, there is provided a wire bonder for wire bonding a semiconductor chip, and a plurality of leads provided in a device region of a lead frame in which the semiconductor chip is mounted, the wire bonder comprising: a heat block for supporting the lead frame in which the device regions are formed side by side and also for heating the lead frame during wire bonding; a frame holding member for pressing the leads of the lead frame disposed over the heat block; a capillary for guiding a wire, the capillary serving as a bonding tool for wire bonding; and an elastic means that is disposed so as to contact with an outside of the device regions of the lead frame on a front surface side of the lead frame over the heat block.

According to yet another aspect of the present invention, there is provided a wire bonder for wire bonding a semiconductor chip, and a plurality of leads provided in a device region of a lead frame in which the semiconductor chip is mounted, the wire bonder comprising: a heat block for supporting the lead frame in which the device regions are formed side by side and also for heating the lead frame during wire bonding; a frame holding member for pressing the leads of the lead frame disposed over the heat block; a capillary for guiding a wire, the capillary serving as a bonding tool for wire bonding; and a roller means that is rotatably disposed so as to contact with an outside of the device regions of the lead frame on both front and back surface sides of the lead frame over the heat block.

According to yet another aspect of the present invention, there is provided a wire bonder for wire bonding a semiconductor chip, and a plurality of leads provided in a device region of a lead frame in which the semiconductor chip is mounted, the wire bonder comprising: a heat block for supporting the lead frame in which the device regions are formed side by side and also for heating the lead frame during wire bonding; a frame holding member for pressing the leads of the lead frame disposed over the heat block; a capillary for guiding a wire, the capillary serving as a bonding tool for wire bonding; and a slow cooling means for cooling a wire-bonded lead frame so that the temperature thereof may decrease stepwise.

According to yet another aspect of the present invention, there is provided a wire bonder for wire bonding a semiconductor chip, and a plurality of leads provided in a device region of a lead frame in which the semiconductor chip is mounted, the wire bonder comprising: a heat block for supporting the lead frame in which the device regions are formed side by side and also for heating the lead frame during wire bonding; a frame holding member capable of pressing the leads of the lead frame disposed over the heat block and also pressing the leads in the device regions disposed in a matrix of rows and columns of the lead frame; and a capillary for guiding a wire, the capillary serving as a bonding tool for wire bonding.

According to yet another aspect of the present invention, there is provided a wire bonder for wire bonding a semiconductor chip, and a plurality of leads provided in a device region of a lead frame in which the semiconductor chip is mounted, the wire bonder comprising: a heat block for supporting the lead frame in which the device regions are formed side by side and also for heating the lead frame during wire bonding; a frame holding member for pressing the leads of the lead frame disposed over the heat block; a capillary for guiding a wire, the capillary serving as a bonding tool for wire bonding; and a plurality of suck means capable of sucking and supporting a plurality of die pads of the lead frame over the heat block.

According to yet another aspect of the present invention, a method of manufacturing a semiconductor chip comprises the steps of: (a) preparing a wiring substrate, wherein a plurality of device regions, in each of which a semiconductor chip is mounted, are formed side by side and wherein a plurality of bonding leads are formed in the respective device regions; (b) mounting the semiconductor chip in the device regions of the wiring substrate, (c) disposing the wiring substrate over a heat block of a wire bonder, and wire bonding the semiconductor chip mounted in the device region and the bonding leads; (d) after the step (c), cooling the wiring substrate so that the temperature thereof may decrease stepwise.

The following explains briefly the effect acquired by the typical invention among the inventions disclosed in the present application.

An improvement in the quality of wire bonding can be achieved by reducing the vibration of a lead frame or a wiring substrate after wire bonding.

An improvement in the reliability of wire bonding can be achieved by reducing the vibration of a lead frame or a wiring substrate after wire bonding.

DETAILED DESCRIPTION OF THE PREFERRED EMBODIMENTS

Figure 1:
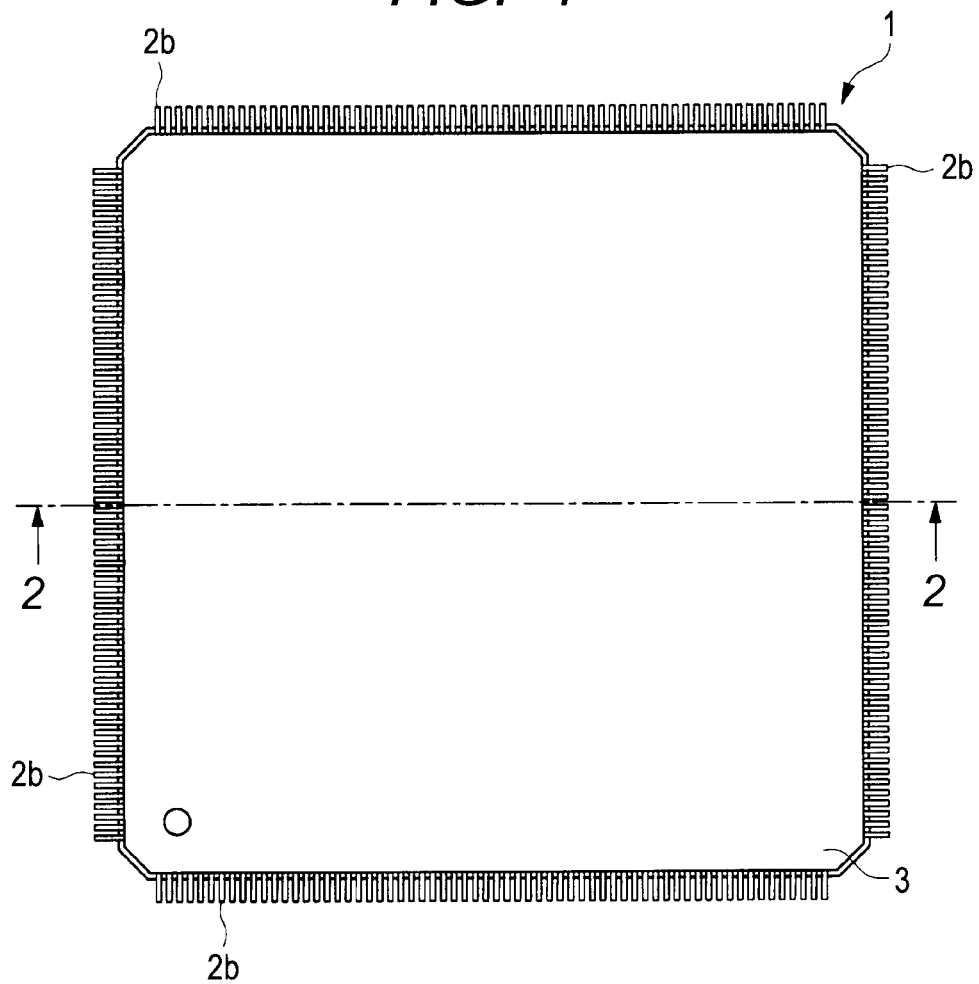
FIG. 1 is a plan view showing an example of the structure of a semiconductor device of a first embodiment of the present invention.

In following embodiments, the explanation of the same or similar parts is not repeated unless otherwise particularly necessary.

Furthermore, the following embodiments will be explained, divided into plural sections or embodiments, if necessary for convenience. Except for the case where it shows clearly in particular, they are not mutually unrelated and one has relationships such as a modification, details, and supplementary explanation of some or entire of another.

In addition, in the following embodiments, when referring to the number of elements, etc. (including the number, a numeric value, an amount, a range, etc.), they may be not restricted to the specific number but may be greater or smaller than the specific number, except for the case where they are clearly specified in particular and where they are clearly restricted to a specific number theoretically.

Furthermore, in the following embodiments, it is needless to say that an element (including an element step etc.) is not necessarily indispensable, except for the case where it is clearly specified in particular and where it is considered to be clearly indispensable from a theoretical point of view, etc.

Moreover, in the following embodiments, when described as "comprises A", "comprising A", "having A", or "including A" with regard to an element or the like, it is needless to say that unless stated explicitly "comprising only a specific element", elements other than this element are not excluded. Similarly, in the following embodiments, when shape, position relationship, etc. of an element etc. is referred to, what resembles or is similar to the shape substantially shall be included, except for the case where it is clearly specified in particular and where it is considered to be clearly not right from a theoretical point of view. This statement also applies to the numeric value and range described above.

Hereinafter, the embodiments of the present invention will be described in detail in accordance with the accompanying drawings. In addition, throughout the accompanying drawings for describing the embodiments, the same member having the same function is given the same reference numeral to omit the repeated explanation.

(First Embodiment)

Figure 2:
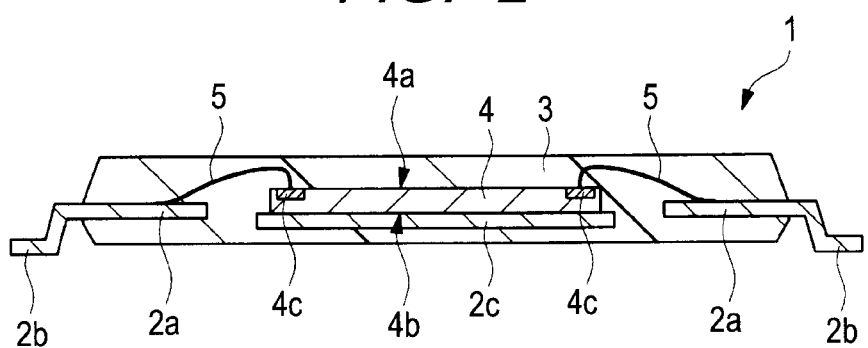
FIG. 2 is a cross sectional view illustrating a structure taken along an A-A line shown in FIG. 1.

FIG. 1 is a plan view showing an example of the structure of a semiconductor device according to a first embodiment of the present invention, and FIG. 2 is a cross sectional view showing a structure taken along an A-A line shown in FIG. 1.

The semiconductor device of the first embodiment is a multi-pin and resin-seal type semiconductor package assembled using a lead frame. In the first embodiment, a multi-pin QFP (Quad Flat Package) 1 as shown in FIG. 1 is taken as an example of the semiconductor device for explanation.

Referring to FIG. 1 and FIG. 2, the QFP1 includes: a semiconductor chip 4 in which a semiconductor integrated circuit is formed; a plurality of inner leads (leads) 2a radially disposed around the semiconductor chip 4; a plurality of outer leads 2b integrally formed with the inner leads 2a; and a plurality of wires 5 such as gold wires for electrically connecting an electrode pad 4c to the corresponding inner lead 2a, the electrode pad 4c being a surface electrode formed in a principal surface 4a of the semiconductor chip 4.

The QFP1 further includes a tab (die pad) 2c serving as a chip mounting part to which the semiconductor chip 4 is fixed via a die bonding material such as a silver paste, and a sealing body 3 for sealing the semiconductor chip 4, the tab 2c, the wires 5, and the inner leads 2a, the sealing body 3 being formed from a sealing resin or the like by resin molding. Since this is a QFP package, the outer leads 2b that are integrally formed with the inner leads 2a, respectively, protrude outward from four sides of the sealing body 3, wherein each of the outer leads 2b is bent and formed in a gull wing shape.

Here, in the semiconductor chip 4 mounted on the QFP1, a plurality of electrode pads 4c formed in the principal surface 4a are provided at a narrow pad pitch equal to or less than 50 μm, for example. This makes it possible to adopt a gold wire with the wire diameter equal to or less than 20 μm for the wire 5, for example, and as a result a reduction in the cost of QFP1 can be achieved and a high-pin-count QFP1 can be also achieved.

In addition, the use of a copper wire instead of a gold wire as the wire 5 can achieve a reduction in the cost of QFP1 as compared with the case of the gold wire, and also can achieve an improvement in the electrical conductivity.

Moreover, the inner lead 2a, the outer lead 2b, and the tab 2c are formed from a thin plate-like member made of a copper alloy and the like, and the sealing body 3 comprises, for example, a thermosetting epoxy resin and the like, and is formed by resin molding.

Next, a method of manufacturing the semiconductor device (QFP1) of the first embodiment will be explained in accordance with a flow diagram shown in FIG. 3.

Figure 3:
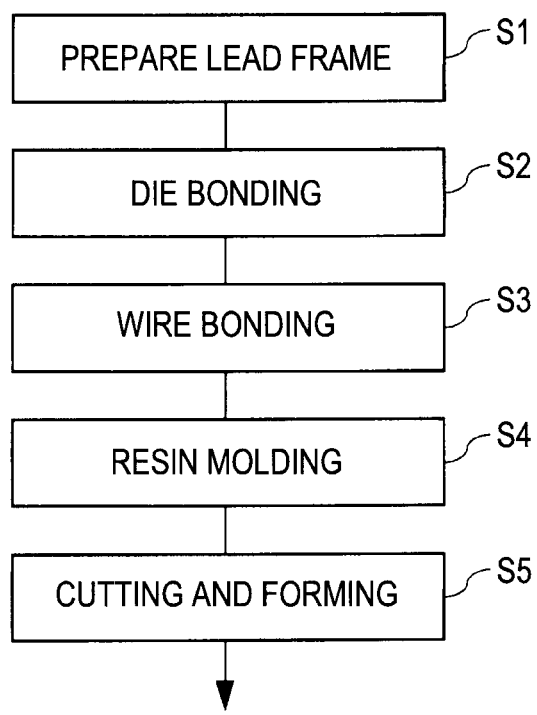
FIG. 3 is a manufacturing flow diagram showing an example of an assembling procedure of the semiconductor device shown in FIG. 1.
Figure 4:
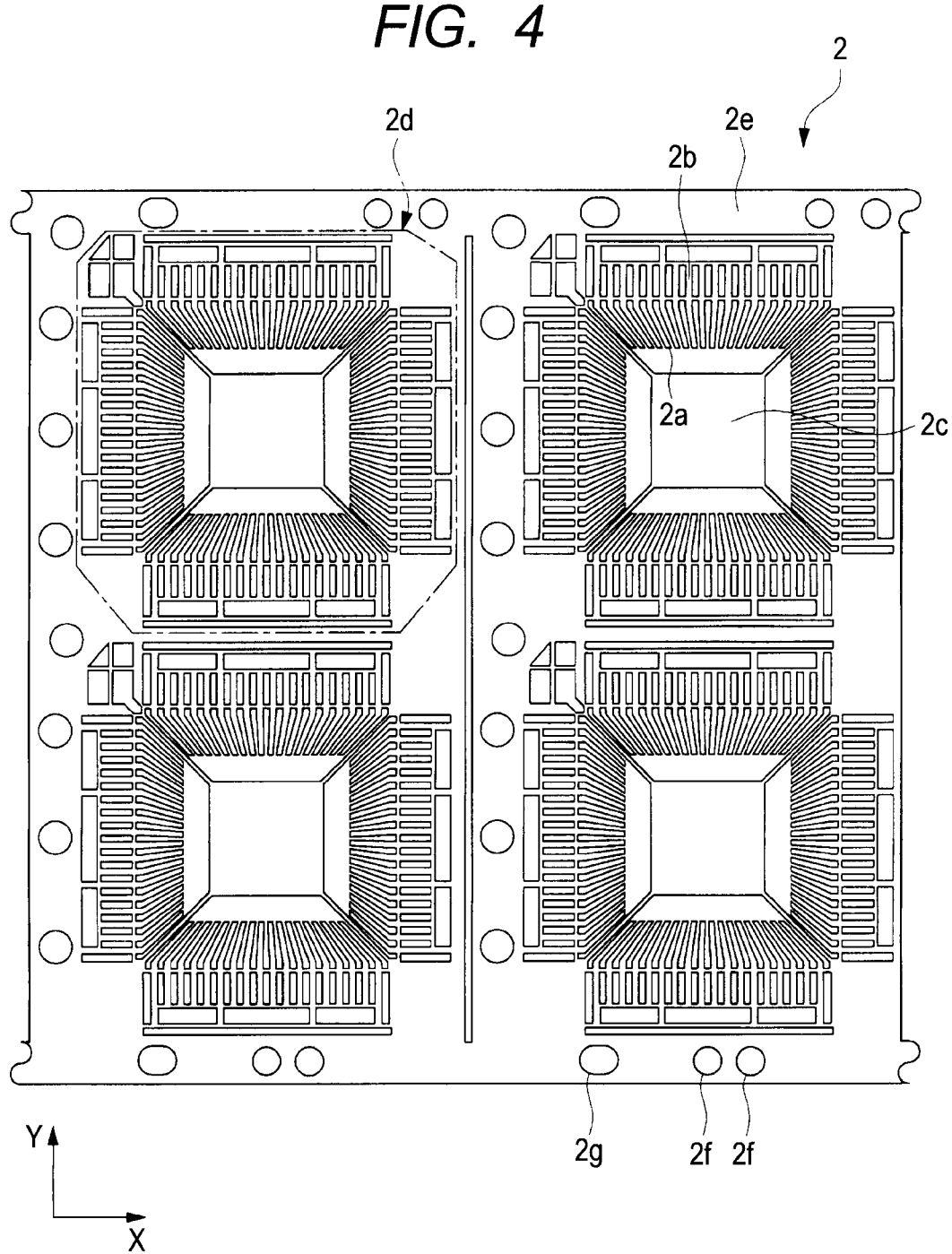
FIG. 4 is an enlarged partial plan view showing an example of the structure of a lead frame used in assembling of the semiconductor device shown in FIG. 1.
Figure 5:
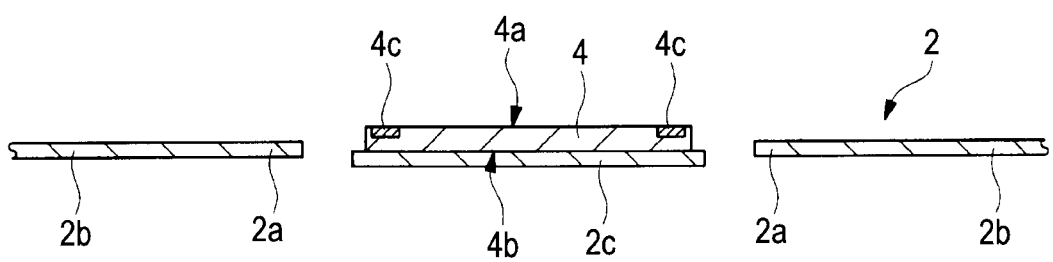
FIG. 5 is a partial sectional view showing an example of the structure after die bonding in assembling of the semiconductor device shown in FIG. 1.
Figure 6:
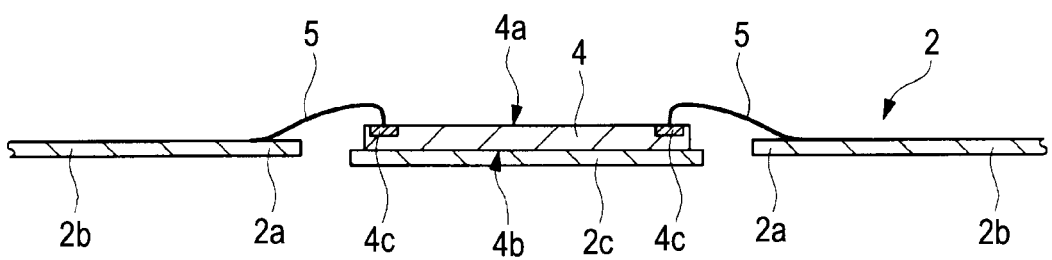
FIG. 6 is a partial sectional view showing an example of the structure after wire bonding in assembling of the semiconductor device shown in FIG. 1.
Figure 7:
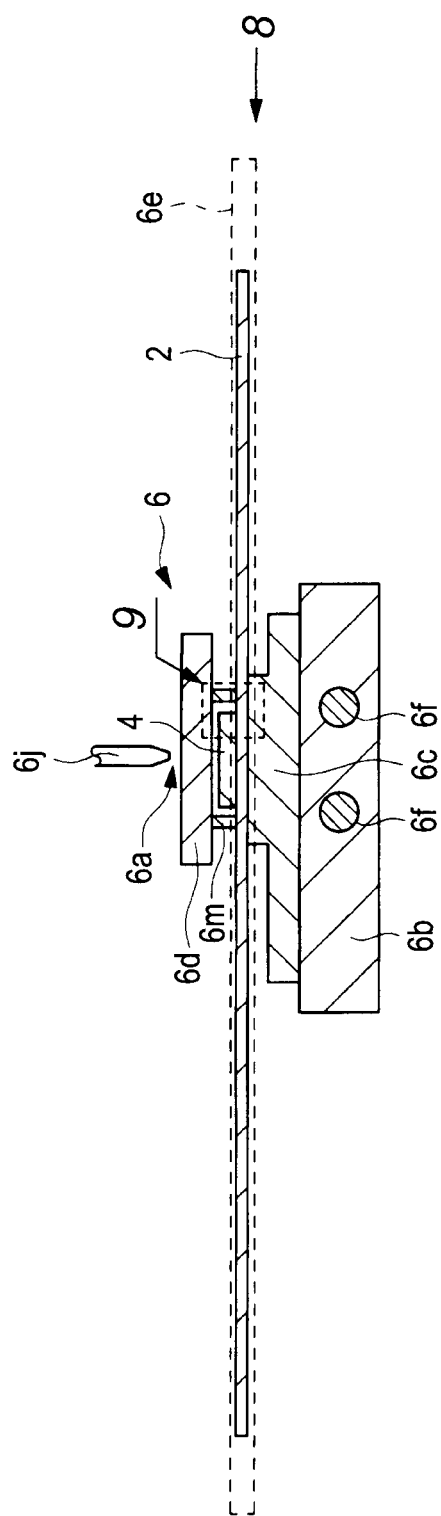
FIG. 7 is a cross sectional view showing an example of the structure of a main part of a wire bonder used in a wire bonding step in assembling of the semiconductor device shown in FIG. 1.
Figure 8:
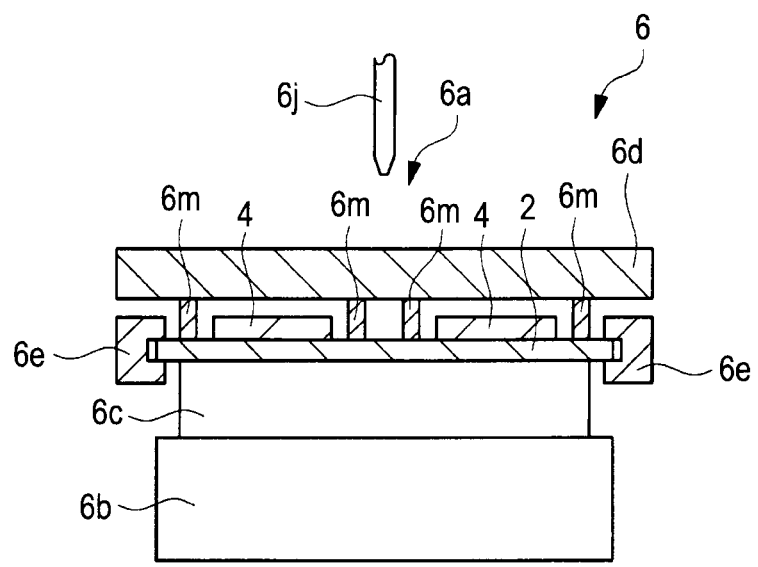
FIG. 8 is a view on arrow B of an example of the structure of the main part of the wire bonder shown in FIG. 7, when viewed from the B direction.
Figure 9:
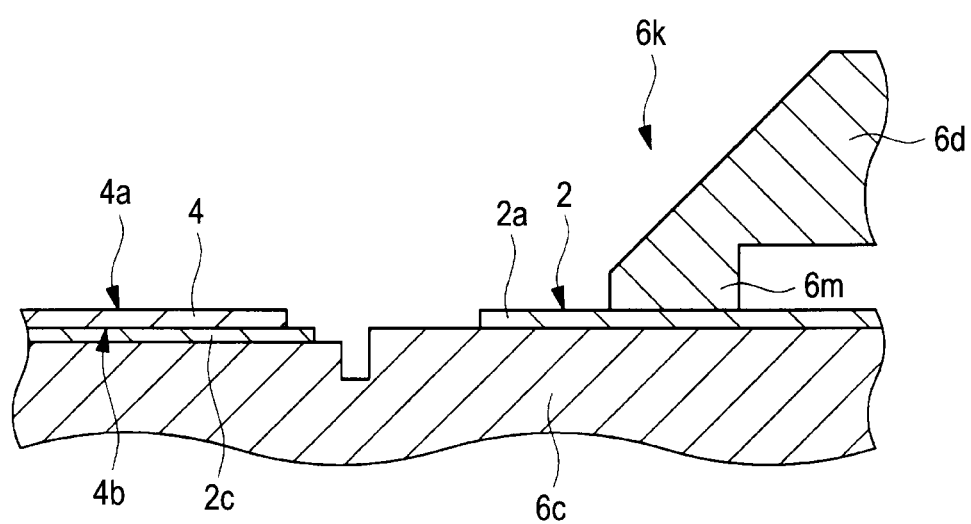
FIG. 9 is an enlarged partial cross-sectional view showing an example of the structure of an A portion of the main part of the wire bonder shown in FIG. 7.
Figure 10:
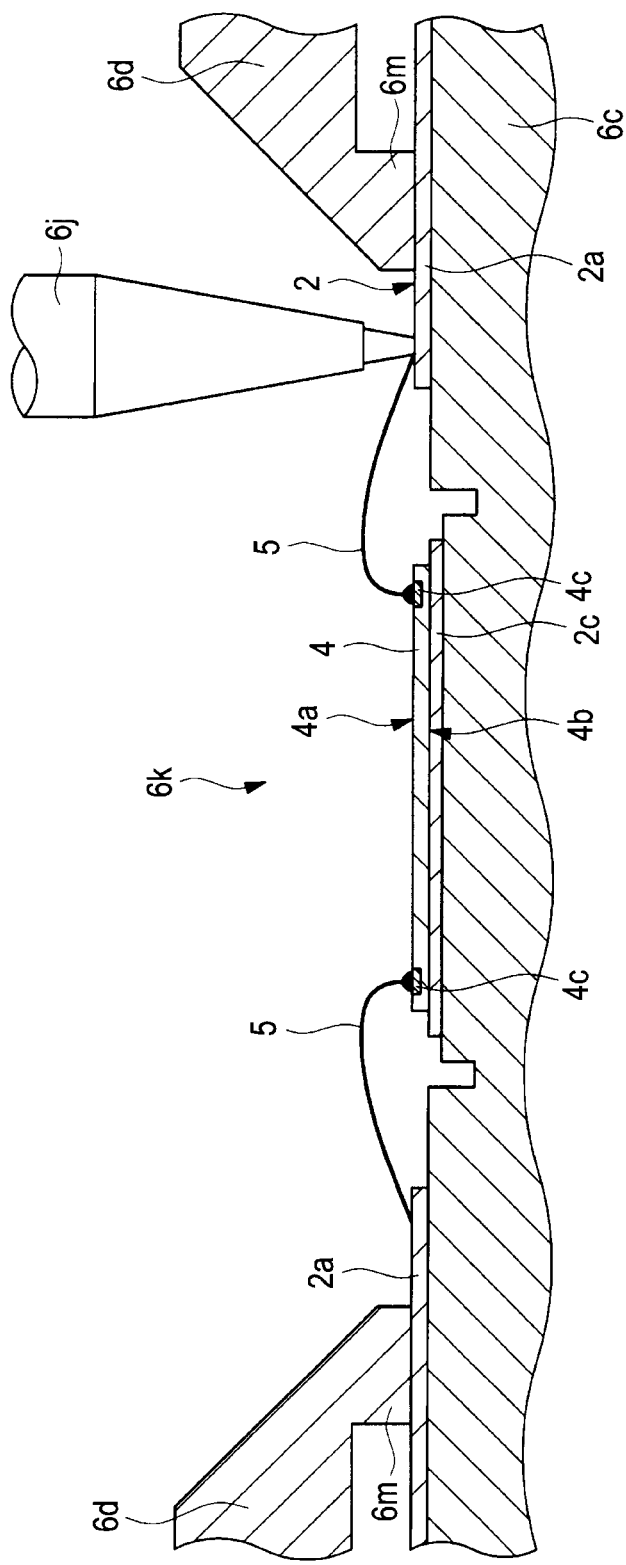
FIG. 10 is an enlarged partial cross-sectional view showing an example of the structure during wire bonding by using the wire bonder shown in FIG. 7.
Figure 11:
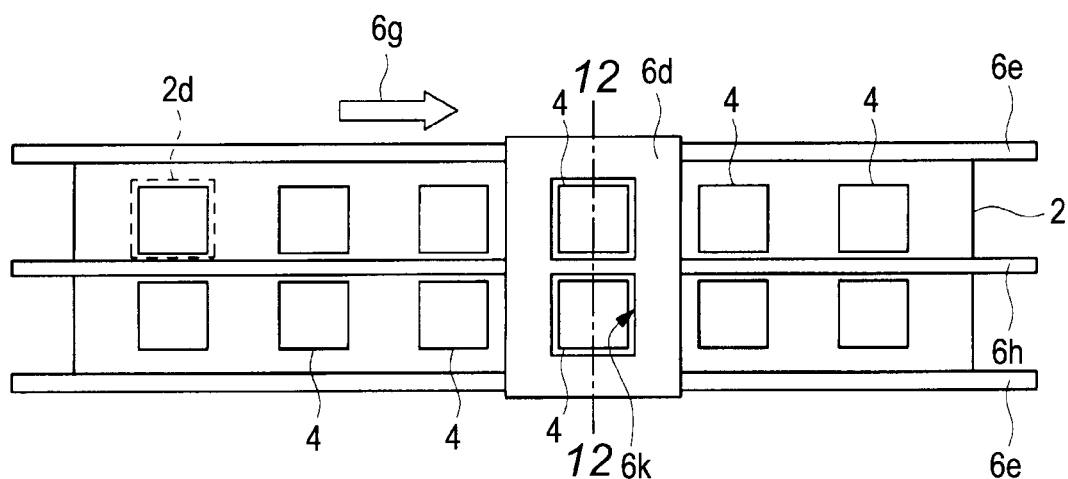
FIG. 11 is a plan view showing an example of the structure of the main part of the wire bonder shown in FIG. 7.
Figure 12:
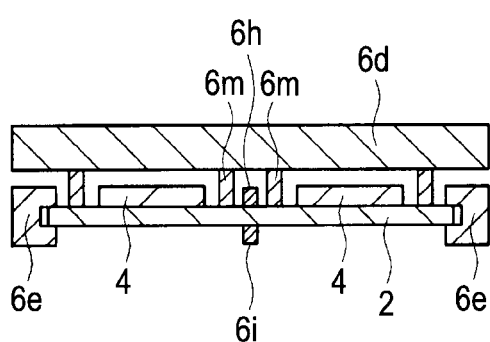
FIG. 12 is a cross sectional view showing a structure taken along an A-A line shown in FIG. 11.
Figure 13:
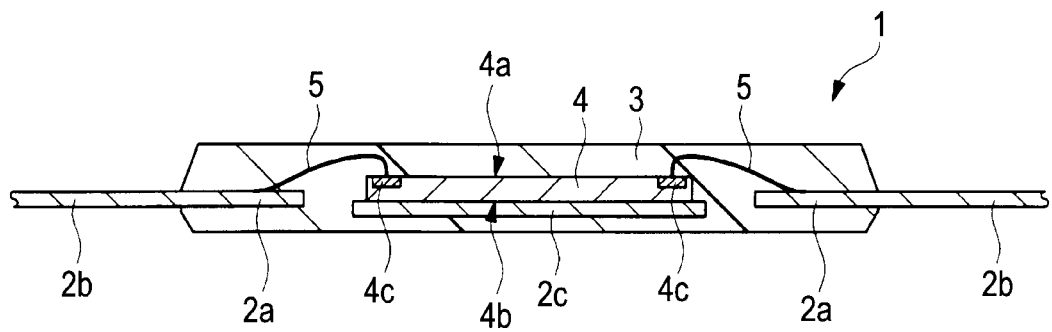
FIG. 13 is a partial sectional view showing an example of the structure after resin molding in assembling of the semiconductor device shown in FIG. 1.
Figure 14:
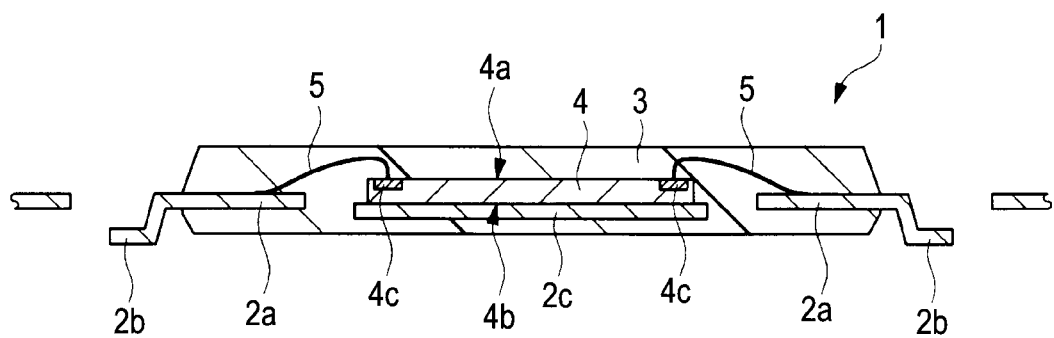
FIG. 14 is a partial sectional view showing an example of the structure after cutting and forming in assembling of the semiconductor device shown in FIG. 1.

FIG. 3 is a manufacturing flow diagram showing an example of an assembling procedure of the semiconductor device shown in FIG. 1, FIG. 4 is an enlarged partial plan view showing an example of the structure of a lead frame used in assembling of the semiconductor device shown in FIG. 1, FIG. 5 is a partial sectional view showing an example of the structure after die bonding in assembling of the semiconductor device shown in FIG. 1, and FIG. 6 is a partial sectional view showing an example of the structure after wire bonding in assembling of the semiconductor device shown in FIG. 1. Moreover, FIG. 7 is a cross sectional view showing an example of the structure of a main part of a wire bonder used in a wire bonding step in assembling of the semiconductor device shown in FIG. 1, FIG. 8 is a view on arrow B of an example of the structure of the main part of the wire bonder shown in FIG. 7, when viewed from the B direction, FIG. 9 is an enlarged partial cross sectional view showing an example of the structure of an A portion of the main part of the wire bonder shown in FIG. 7, and FIG. 10 is an enlarged partial cross-sectional view showing an example of the structure during wire bonding using the wire bonder shown in FIG. 7. Furthermore, FIG. 11 is a plan view showing an example of the structure of the main part of the wire bonder shown in FIG. 7, FIG. 12 is a cross sectional view showing a structure taken along an A-A line shown in FIG. 11, FIG. 13 is a partial sectional view showing an example of the structure after resin molding in assembling of the semiconductor device shown in FIG. 1, and FIG. 14 is a partial sectional view showing an example of the structure after cutting and forming in assembling of the semiconductor device shown in FIG. 1.

First, a lead frame is prepared in Step S1 of FIG. 3. Here, a matrix frame 2 that is an example of the lead frame shown in FIG. 4 is prepared. In the matrix frame 2, a plurality of device regions 2d, in each of which the semiconductor chip 4 is mounted, are formed side by side, and also the inner leads (lead) 2a and the outer leads 2b are provided in the respective device regions 2d.

In the matrix frame 2 shown in FIG. 4 used in the first embodiment, the device regions 2d, each serving as a region for forming one QFP1, are formed in a matrix arrangement of multiple rows×multiple columns (e.g., 2 rows×2 columns in FIG. 4), wherein one tab (die pad) 2c, the inner leads 2a, the outer leads 2b, and the like are formed in each of the device regions 2d.

Moreover, the matrix frame 2 is a rectangular thin plate material formed from, for example, a copper alloy and the like, wherein the tab 2c, the inner leads 2a, and the outer leads 2b are integrally formed. In the matrix frame 2 shown in FIG. 4, the X direction means the longitudinal direction of the rectangular and the Y direction means the width direction of the rectangular.

Moreover, in a frame part 2e at both ends in the width direction of the matrix frame 2, there are provided a plurality of positioning long-holes 2g and guide sprocket holes 2f used in the assembly process.

Note that, although the number of inner leads 2a of one device region 2d in the matrix frame 2 shown in FIG. 4 differs from the number of outer leads 2b in QFP1 shown in FIG. 1, this is for clearly showing the shape of the lead portion of the matrix frame 2. It is needless to say that the number of inner leads 2a of one device region 2d of the matrix frame 2 used for assembling QFP1 is the same as that of the outer leads 2b.

Thereafter, die bonding shown in Step S2 of FIG. 3 is performed. Here, the semiconductor chip 4 is mounted on the tab 2c of the device regions 2d of the matrix frame 2 via a die bonding material as shown in FIG. 5. That is, a rear surface 4b of the semiconductor chip 4 is bonded to the tab 2c by using the die bonding material.

Thereafter, wire bonding shown in Step S3 of FIG. 3 is performed. That is, as shown in FIG. 6, the electrode pad 4c in the principal surface 4a of the semiconductor chip 4 is electrically connected to the corresponding inner lead 2a by using the wire 5. Note that, the wire 5 is, for example, a gold wire having a reduced diameter, and is the gold wire with the wire diameter equal to or less than 20 μm.

Now, a wire bonder 6 shown in FIG. 7 and FIG. 8 used in a wire-bonding Step S3 will be described.

The wire bonder 6 includes as its main part: a heat block 6b for supporting the matrix frame 2 installed in a wire bond portion 6a where wire bonding is performed, the matrix frame 2 having the device regions 2d formed side by side therein, and also for heating the matrix frame 2 during wire bonding; a platen 6c disposed over the heat block 6b, the platen capable of supporting the matrix frame 2 in response to the shape of its matrix frame 2; and a heater 6f incorporated in the heat block 6b.

That is, through the use of the heater 6f incorporated in the heat block 6b, during wire bonding, the matrix frame 2 and the semiconductor chip 4 mounted over the tab 2c of the device region 2d are heated to a desired temperature via the platen 6c disposed over the heat block 6b. During wire bonding, the temperature of the heater 6f is always set to 230° C., for example, so as to heat the matrix frame 2 and the semiconductor chip 4.

Note that, the platen 6c accommodates the shape of the matrix frame 2, and is a block material for supporting the matrix frame 2 and also transferring the heat from the heat block 6b to the matrix frame 2 and the semiconductor chip 4. For example, the platen 6c corresponds to the shape of a lowered tab or raised tab of the lead frame.

Moreover, the wire bonder 6 includes: a frame holding member 6d for pressing the inner leads 2a of the matrix frame 2 disposed over the heat block 6b in the wire bond portion 6a; a capillary 6j for guiding the wire 5, the capillary 6j being a bonding tool for wire bonding; and a rail 6e serving as a guide and guiding the matrix frame 2 when the matrix frame 2 is transferred to a feeding direction 6g.

The frame holding member 6d has formed therein an opening window 6k corresponding to the device region 2d of the matrix frame 2, as shown in FIG. 11. That is, as shown in FIG. 9 and FIG. 10, during wire bonding, the inner lead 2a is pressed from above by using a protruding portion 6m of the frame holding member 6d so that the inner lead 2a may not flap, and wire bonding is performed by operating the capillary 6j in the opening window 6k. Accordingly, when the number of columns of device regions 2d in the width direction (Y direction shown in FIG. 4) of the rectangular matrix frame 2 is two, two opening windows 6k that correspond to two columns of device regions 2d, respectively, are formed in the frame holding member 6d as shown in FIG. 11. Note that, the protruding portion 6m of the frame holding member 6d for pressing the inner lead 2a is formed in a frame shape along the opening window 6k.

Moreover, as shown in FIG. 7, FIG. 11, and FIG. 12, on both the front and back surface sides of the matrix frame 2 over the heat block 6b, the wire bonder 6 includes an upper guide 6h and a lower guide 6i serving as elongated guide members that are disposed so as to contact with the outside of the respective device regions 2d of the matrix frame 2 along the longitudinal direction (X direction shown in FIG. 4) of the matrix frame 2.

That is, the upper guide 6h and the lower guide 6i contact with the front surface side (side on which the semiconductor chip 4 is mounted) and the rear surface side (side on which the semiconductor chip 4 is not mounted) of the matrix frame 2 over the heat block 6b, respectively, so as to reduce vibration of the matrix frame 2 during wire bonding and after wire bonding. Accordingly, the upper guide 6h and the lower guide 6i are preferably formed in an elongated rod shape because they press an area between the respective device regions 2d of the matrix frame 2. Furthermore, the upper guide 6h and the lower guide 6i are preferably formed to have such a length equal to or a little greater than that in the longitudinal direction of the matrix frame 2. However, the upper guide 6h and the lower guide 6i may be formed to have a length such that the upper guide 6h and the lower guide 6i contact only with the vicinity of a rear stage portion of the frame holding member 6d in the feeding direction 6g of the matrix frame 2 so as to be able to suppress the vibration of the matrix frame 2 at least after wire bonding.

By setting the lengths of the upper guide 6h and the lower guide 6i equal to or greater than that in the longitudinal direction of the matrix frame 2, the entire vibration of the frame can be suppressed.

Note that, in the examples shown in FIG. 11 and FIG. 12 of the first embodiment, the upper guide 6h is in contact with the front surface side of the matrix frame 2 while the lower guide 6i is in contact with the rear surface side. However, only either one of the upper guide 6h and the lower guide 6i may be provided, or both of them may be provided.

Moreover, the upper guide 6h is supported by the frame holding member 6d while the lower guide 6i is supported by the platen 6c, for example. However, both may be supported by the rail 6e or the like.

In addition, when the number of columns of device regions 2d in the width direction of the matrix frame 2 is three or more, the numbers of the upper guides 6h and lower guides 6i that are brought in contact with an area between the device regions 2d can be increased.

Moreover, mirror finish of the upper guide 6h and lower guide 6i can reduce dusting due to the contact of the upper guide 6h and lower guide 6i with the matrix frame 2.

Wire bonding is performed by using the wire bonder 6 as described above. That is, after disposing the matrix frame 2 over the heat block 6b of the wire bonder 6, the electrode pad 4c of the semiconductor chip 4 mounted in the tab 2c shown in FIG. 6 of the device region 2d is wire-bonded to the inner lead 2a with the inner leads 2a pressed by the protruding portion 6m of the frame holding member 6d, as shown in FIG. 10. In such a case, the matrix frame 2 is wire bonded with the front surface side being pressed by the upper guide 6h and the rear surface side being pressed by the lower guide 6i.

After the wire bonding, the frame holding member 6d goes up so as to release the matrix frame 2. In such a case, the vibration of the matrix frame 2 can be suppressed because the rear surface side of the matrix frame is pressed by the lower guide 6i.

Thereafter, the matrix frame 2 is transported to the feeding direction 6g by one device region, and wire bonding of the next device region 2d is performed in a similar manner.

By sequentially performing wire bonding in this manner, wire bonding to one matrix frame 2 will be completed.

After the wire bonding process is completed, resin molding shown in Step S4 of FIG. 3 is performed. Here, with the use of a resin forming mold (not illustrated), the tab 2c, the semiconductor chip 4, the inner leads 2a, and the wire 5 shown in FIG. 13 in the device region 2d of the matrix frame 2 are resin-sealed by using a sealing resin, and as a result, the sealing body 3 is formed. Note that the sealing resin is, for example, a thermosetting epoxy resin or the like.

Thereafter, cutting and forming shown in Step S5 of FIG. 3 are performed. Here, the matrix frame 2 is cut and singulated into individual package unit. In such a case, as shown in FIG. 14, each of the outer leads 2b protruding from the sealing body 3 is bent and formed in a gull wing shape, and then the assembly of QFP1 is completed.

According to the method of manufacturing a semiconductor device and the wire bonder 6 of the first embodiment, on both the front and back surface sides of the matrix frame 2 over the heat block 6b, the upper guide 6h and the lower guide 6i are disposed so as to contact along the longitudinal direction of the matrix frame 2 (X direction shown in FIG. 4), and thus the vibration of the matrix frame 2 during wire bonding and after wire bonding can be reduced.

Thus, an improvement in the quality of wire bonding can be achieved.

Furthermore, an improvement in the reliability of wire bonding can be achieved.

That is, in the matrix frame 2 after wire bonding, even if thermal shrinkage occurs when the inner lead 2a of the lead frame elongated by heat is abruptly cooled to return to the original state, the vibration in such a case can be reduced because the matrix frame 2 is pressed by the upper guide 6h and the lower guide 6i.

Moreover, in the matrix frame 2 after wire bonding, even if there occurs a difference at each location in the stress, which is caused by a dispersion of temperature changes due to a difference in the heat radiation paths of the respective inner leads when being abruptly cooled, the vibration in this case can be reduced because the matrix frame 2 is similarly pressed by the upper guide 6h and the lower guide 6i.

Note that, in the case of QFP1 of the first embodiment, as the wire 5 using a gold wire, the wire 5 whose diameter is reduced to 20 µm or less is adopted. Also in this case, deformation of the wire 5 also can be reduced because the vibration of the matrix frame 2 after wire bonding can be reduced, and as a result, the occurrence of a short-circuit between wires or a short-circuit between a wire and a chip can be suppressed.

Moreover, in the case of QFP1 of the first embodiment, the matrix frame 2 comprising a copper alloy is taken as an example and such a matrix frame 2 deforms relatively easily. However, in the wire bonder 6 of the first embodiment, because the matrix frame 2 is pressed by the upper guide 6h and the lower guide 6i, the deformation of the matrix frame 2 after wire bonding can be also suppressed.

Furthermore, in the case of the rectangular matrix frame as in the first embodiment, the length in the width direction is longer than that of a single row of frames because the regions 2d are formed also in the width direction (Y direction of FIG. 4). Accordingly, in the case of the matrix frame 2, the matrix frame 2 deforms easily also in the width direction. However, in the wire bonder 6 of the first embodiment, because the matrix frame 2 is pressed by the upper guide 6h and the lower guide 6i as with the above case, the deformation of the matrix frame 2 after wire bonding can be also suppressed.

Next, a first modification of the first embodiment will be described.

Figure 15:
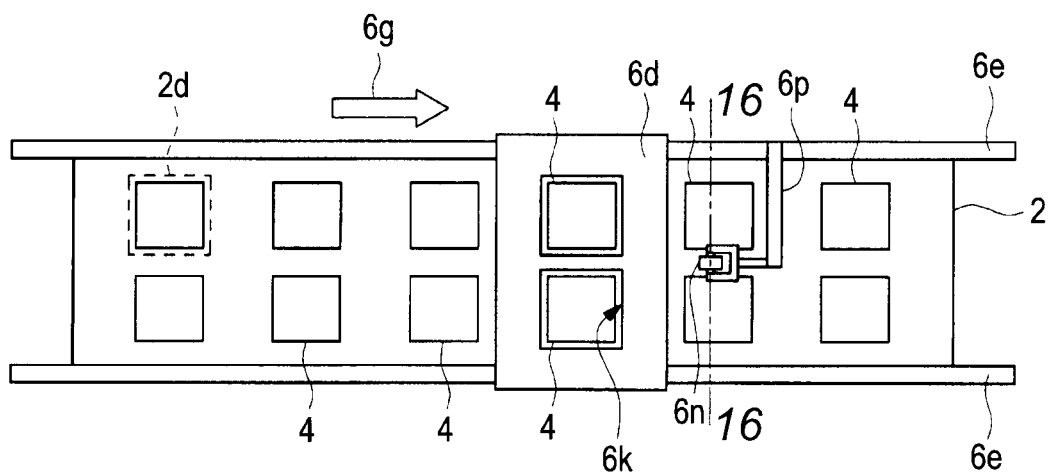
FIG. 15 is a plan view showing a structure of a first modification of the first embodiment of the present invention.
Figure 16:
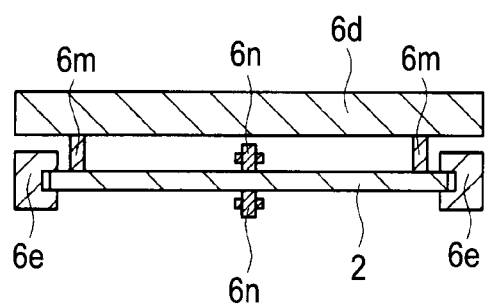
FIG. 16 is a cross sectional view showing a structure taken along an A-A line shown in FIG. 15.
Figure 17:
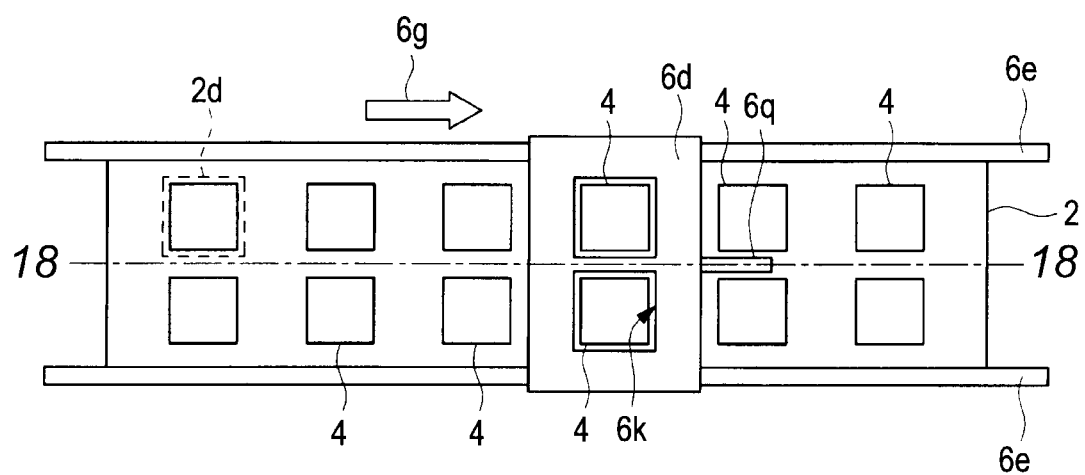
FIG. 17 is a plan view showing a structure of a second modification of the first embodiment of the present invention.
Figure 18:
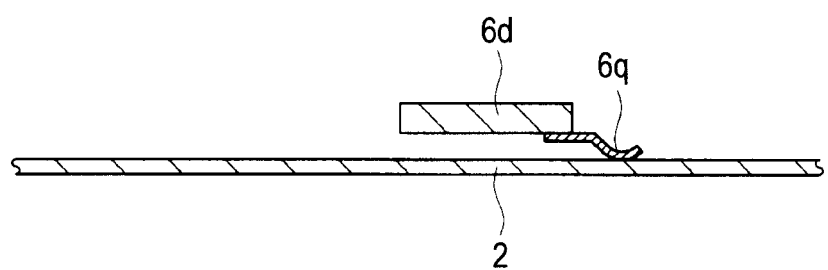
FIG. 18 is a cross sectional view showing a structure taken along an A-A line shown in FIG. 17.
Figure 19:
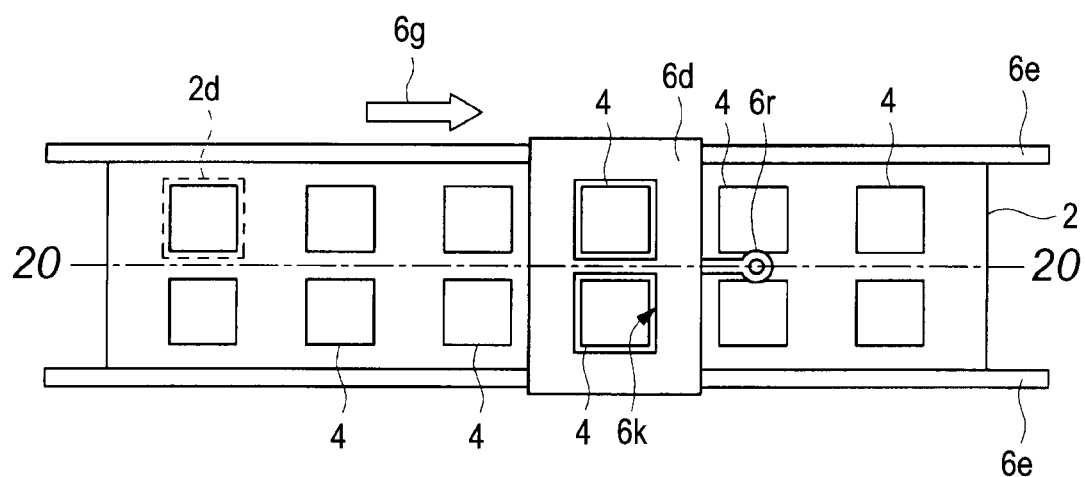
FIG. 19 is a plan view showing a structure of a third modification of the first embodiment of the present invention.
Figure 20:
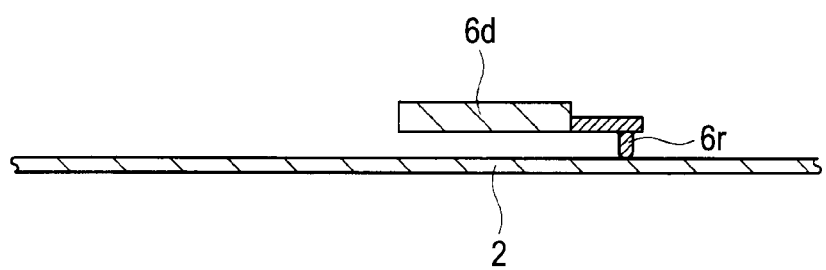
FIG. 20 is a cross sectional view showing a structure taken along an A-A line shown in FIG. 19.
Figure 21:
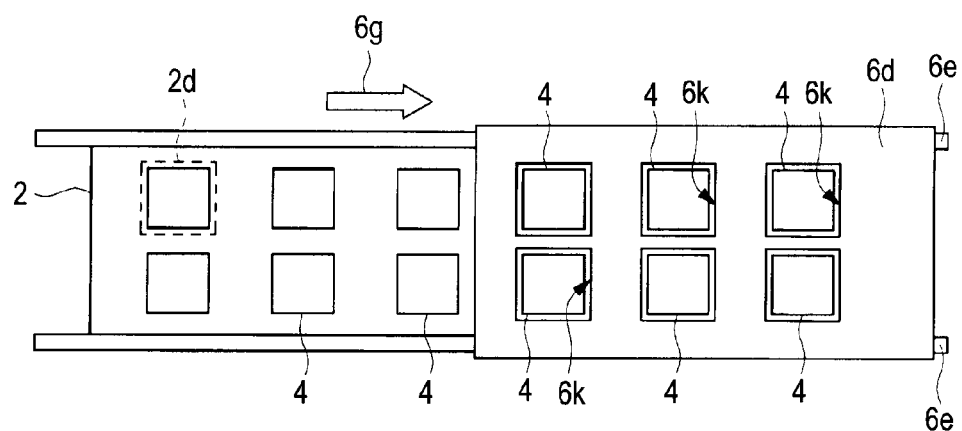
FIG. 21 is a plan view showing a structure of a fourth modification of the first embodiment of the present invention.

FIG. 15 is a plan view showing a structure of a first modification of the first embodiment of the present invention, FIG. 16 is a cross sectional view showing a structure taken along an A-A line shown in FIG. 15, FIG. 17 is a plan view showing a structure of a second modification of the first embodiment of the present invention, and FIG. 18 is a cross sectional view showing a structure taken along an A-A line shown in FIG. 17. Moreover, FIG. 19 is a plan view showing a structure of a third modification of the first embodiment of the present invention, FIG. 20 is a cross sectional view showing a structure taken along an A-A line shown in FIG. 19, and FIG. 21 is a plan view showing a structure of a fourth modification of the first embodiment of the present invention.

According to the first modification shown in FIG. 15 and FIG. 16, in the wire bonder 6 shown in FIG. 7 a roller (roller means) 6n is rotatably disposed so as to contact with an outside of the device regions 2d of the matrix frame 2, on both the front and back surface sides of the matrix frame 2 over the heat block 6b.

That is, on both the front and back surface sides of the matrix frame 2, the rotatable roller 6n is provided so as to contact with the outside of the respective device regions 2d in the vicinity of a rear stage portion of the frame holding member 6d in the feeding direction 6g of the matrix frame 2. The matrix frame 2 is pressed from both the front and back surface sides of the matrix frame 2 by the roller 6n so as to suppress the vibration of the matrix frame 2. The roller 6n is rotatably supported by a roller holder 6p and furthermore the roller holder 6p is supported by the rail 6e, for example.

Thus, the wire bonding and the transport of the frame after wire bonding are performed with the rotatable roller 6n being contacted with the outside of the respective device regions 2d of the matrix frame 2, on both the front and back surface sides of the matrix frame 2.

Note that, because of the press by the roller 6n, a portion vibrating most severely of the matrix frame 2 can be pressed in a pinpoint manner.

Because of the press by the roller 6n and the rotation of the contact portion, dusting due to friction with the matrix frame 2 can be suppressed. Furthermore, the use of the roller 6n can reduce the resistance in conveying the frame and can reduce troubles in conveying the frame. Note that, when the roller 6n is disposed between the rows of device regions 2d, the number of rollers 6n disposed between the rows may be one or may be more than one.

As described above, also with the first modification shown in FIG. 15 and FIG. 16, the vibration of the matrix frame 2 during wire bonding and after wire bonding can be reduced.

Thus, an improvement in the quality of wire bonding can be achieved.

Furthermore, an improvement in the reliability of wire bonding can be achieved.

In addition, since other effects obtained by the first modification shown in FIG. 15 and FIG. 16 are the same as the effects obtained by the upper guide 6h and the lower guide 6i shown in FIG. 11 and FIG. 12, the repeated explanation is omitted.

Next, according to a second modification shown in FIG. 17 and FIG. 18, in the wire bonder 6 shown in FIG. 7 a blade spring member (elastic means) 6q is disposed so as to contact with an outside of the respective device regions 2d of the matrix frame 2, on the front surface side of the matrix frame 2 over the heat block 6b.

That is, on the front surface (chip mounting surface) side of the matrix frame 2, the blade spring member 6q is provided so as to contact with an outside of the respective device regions 2d in the vicinity of the rear stage portion of the frame holding member 6d in the feeding direction 6g of the matrix frame 2. The blade spring member 6q is attached to the frame holding member 6d so that the matrix frame 2 may be pressed by an elastic force even if the frame holding member 6d goes up.

Thus, on the front surface side of the matrix frame 2, the wire bonding and the transport of the frame after wire bonding can be performed with the blade spring member 6q always contacted with the outside of the respective device regions 2d of the matrix frame 2.

Note that, as with the press by the roller 6n, also in the case of the press by the blade spring member 6q, a portion of the matrix frame 2, the portion vibrating most severely, can be pressed in a pinpoint manner.

Next, according to a third modification shown in FIG. 19 and FIG. 20, in the wire bonder 6 shown in FIG. 7 a shock absorber member (elastic means) 6r is disposed so as to contact with an outside of the respective device regions 2d of the matrix frame 2, on the front surface side of the matrix frame 2 over the heat block 6b.

That is, as the elastic means in place of the blade spring member 6q shown in FIG. 18, the shock absorber member 6r having a coil spring embedded therein is adopted. As shown in FIG. 20, on the front surface side of the matrix frame 2, the shock absorber member 6r is provided so as to contact with the outside of the respective device regions 2d in the vicinity of the rear stage portion of the frame holding member 6d in the feeding direction 6g of the matrix frame 2. The shock absorber member 6r, as with the blade spring member 6q, is attached to the frame holding member 6d so that the matrix frame 2 may be pressed by an elastic force even if the frame holding member 6d goes up.

Thus, on the front surface side of the matrix frame 2, the wire bonding and the transport of the frame after wire bonding can be performed with the shock absorber member 6r always being contacted to the outside of the respective device regions 2d of the matrix frame 2.

Note that, also when the shock absorber member 6r is used, a portion vibrating most severely of the matrix frame 2 can be pressed in a pinpoint manner as with the case of the blade spring member 6q.

Moreover, also when the blade spring member 6q or the shock absorber member 6r is adopted, dusting due to friction with the matrix frame 2 can be suppressed because there are few contact portions with the matrix frame 2.

Furthermore, when an elastic means, such as the blade spring member 6q or the shock absorber member 6r, is adopted, absorption of the vibration of the matrix frame 2 can be performed more effectively because these elastic means can be always contacted with the surface of the matrix frame 2. Note that, also in the case of the elastic means, such as the blade spring member 6q or the shock absorber member 6r, although the elastic means is disposed between the rows of device regions 2d, the number of elastic means disposed between the rows may be one or may be more than one.

Next, according to a fourth modification shown in FIG. 21, the wire bonder 6 shown in FIG. 7 is provided with the frame holding member 6d capable of pressing the inner leads 2a of the matrix frame 2 disposed over the heat block 6b and also pressing the inner leads 2a of the device regions 2d arranged in a matrix of the matrix frame 2.

That is, the wire bonder 6 is provided with the long frame-holding member 6d capable of pressing the inner leads 2a of the respective device regions 2d of multiple rows×multiple columns altogether. Such a long frame-holding member 6d is provided on both the front and back surface sides of the matrix frame 2.

Since the long frame-holding member 6d mechanically presses both the front and back surfaces of the matrix frame 2, the vibration of the matrix frame 2 can be reduced further.

In the case of the frame holding member 6d shown in FIG. 21, a significant effect can be obtained on the vibration of the matrix frame 2 by adopting a structure in which the entire matrix frame is clamped and transported as is (carrier transport).

As described above, also by using the second modification shown in FIG. 17 and FIG. 18, the third modification shown in FIG. 19 and FIG. 20, and the fourth modification shown in FIG. 21, the vibration of the matrix frame 2 during wire bonding and after wire bonding can be reduced.

Thus, an improvement in the quality of wire bonding can be achieved.

Furthermore, an improvement in the reliability of wire bonding can be achieved.

In addition, since other effects obtained by the second modification shown in FIG. 17 and FIG. 18, the third modification shown in FIG. 19 and FIG. 20, and the fourth modification shown in FIG. 21 are the same as the effects obtained by the upper guide 6h and the lower guide 6i shown in FIG. 11 and FIG. 12, the repeated explanation is omitted.

(Second Embodiment)

Figure 22:
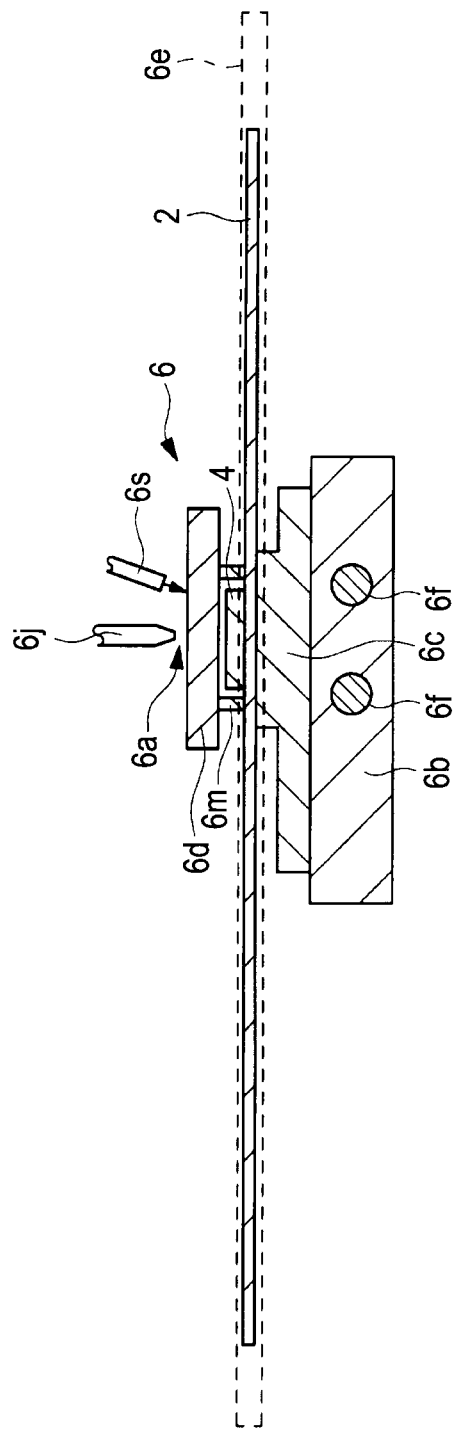
FIG. 22 is a cross sectional view showing an example of the structure of a main part of a wire bonder used in assembling of a semiconductor device according to a second embodiment of the present invention.
Figure 23:
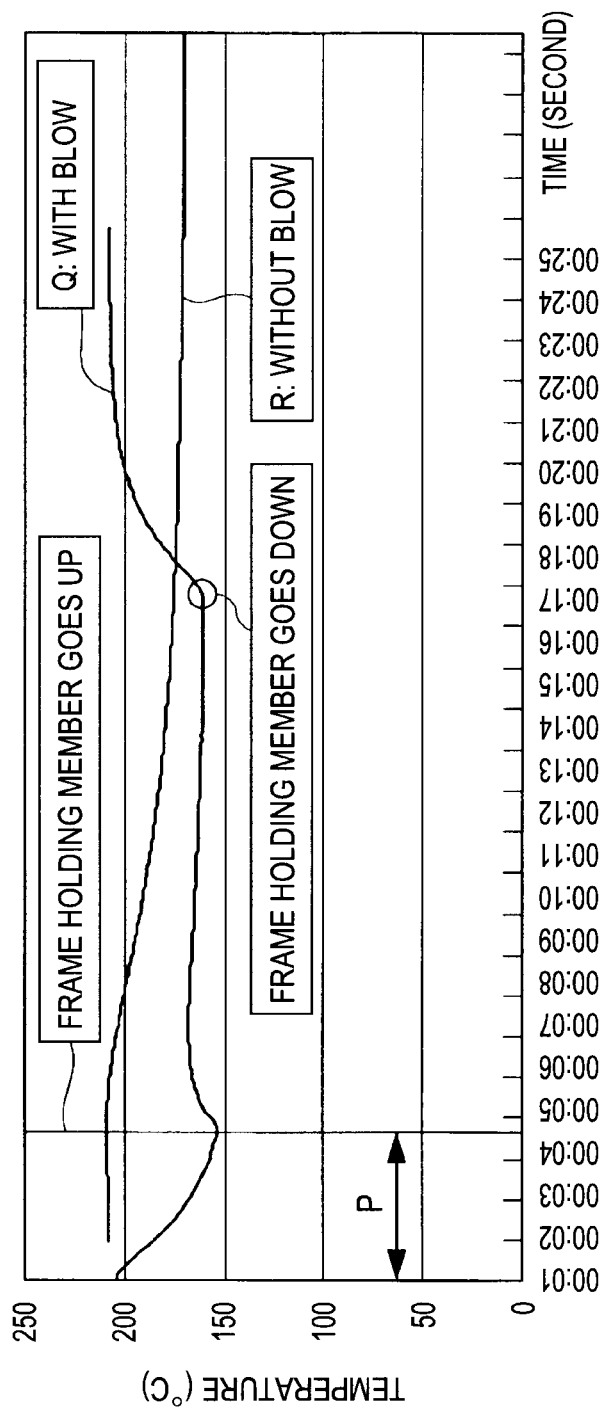
FIG. 23 is temperature data showing an example of temperature changes of a lead frame after wire bonding in the wire bonder shown in FIG. 22.

FIG. 22 is a cross sectional view showing an example of the structure of a main part of a wire bonder used in assembling of a semiconductor device according to a second embodiment of the present invention, and FIG. 23 is temperature data showing an example of temperature changes of the lead frame after wire bonding in the wire bonder shown in FIG. 22.

In the second embodiment, as the means for reducing the vibration of the lead frame after wire bonding, different from pressing the lead frame (matrix frame 2) as in the first embodiment, the vibration of the lead frame is reduced by cooling the lead frame such that the temperature thereof may decrease stepwise after wire bonding.

That is, one of the causes of the vibration of the lead frame after wire bonding may be thermal shrinkage when an inner lead elongated due to heat is abruptly cooled to return to the original state, and this thermal shrinkage may cause the vibration. Accordingly, it is effective to cool the wire-bonded lead frame under temperature control so that the temperature thereof may gradually decrease stepwise. Thus, the occurrence of vibration of the lead frame after wire bonding can be suppressed.

Here, the main part of the wire bonder 6 of the second embodiment shown in FIG. 22 will be described. Over the heat block 6b in the wire bond portion 6a of the wire bonder 6, there is provided a cooling blower 6s that is a slow cooling means for cooling a wire-bonded lead frame so that the temperature thereof may decrease stepwise, and temperature control of the matrix frame 2 is performed so that the temperature of the matrix frame 2 after wire bonding may decrease stepwise. Note that other structures of the wire bonder 6 shown in FIG. 22 are the same as those of the main part of the wire bonder 6 of the first embodiment shown in FIG. 7. However, the upper guide 6h and the lower guide 6i disposed under the frame holding member 6d shown in FIG. 7 may be provided or may not be provided.

In the wire bonding process, wire bonding is performed using the wire bonder 6 shown in FIG. 22, with the inner leads 2a being pressed by the frame holding member 6d, and thereafter the temperature of the matrix frame 2 is reduced stepwise (gradually) by blowing cold air from the cooling blower 6 to the matrix frame 2.

In this case, the matrix frame 2 is preferably cooled, with the inner leads 2a being pressed by the frame holding member 6d, and thereafter the matrix frame 2 is transported to the rear stage after releasing the frame holding member 6d.

FIG. 23 compares the temperatures of a lead frame after wire bonding a case with the cooling blower (Q) and a case without the cooling blower (R). In the example shown in FIG. 23, after wire bonding, the cooling blower 6s is stopped in approximately 3 to 4 seconds after starting blowing of the cooling blower 6s, and thereafter the frame holding member 6d is raised to release the lead frame. Here, the cooling blow is performed within the range P (for approximately 3 to 4 seconds). Furthermore, within the range P, instead of abruptly reducing the temperature of the lead frame, the cooling blow is performed so that the temperature of the lead frame may gradually decrease stepwise.

As a result of the test performed under such conditions, a reduction of the vibration of the lead frame could be confirmed in the case with the cooling blower 6s (Q). On the other hand, in the case without the cooling blower 6s (R), a reduction effect of the vibration cannot be obtained because the temperature of the lead frame cannot be reduced.

It is needless to say that the time length of the range P and the method of reducing temperature stepwise (the angle of the temperature gradient) are not limited to the values shown in FIG. 23, but can be modified properly.

As described above, in the method of manufacturing a semiconductor device according to the second embodiment, the occurrence of thermal shrinkage when the inner lead 2a of the heated matrix frame 2 is abruptly cooled to return to the original state can be suppressed by cooling the matrix frame 2 so that the temperature thereof may decrease gradually after wire bonding. Thus, the vibration of the matrix frame 2 after wire bonding can be reduced.

That is, after wire bonding, the matrix frame 2 is cooled under temperature control so that the temperature thereof may decrease not abruptly but gradually, and thereby the vibration of the matrix frame 2 after wire bonding can be reduced.

As a result, an improvement in the quality of wire bonding can be achieved.

Furthermore, an improvement in the reliability of wire bonding can be achieved.

Note that, in cooling the matrix frame 2 so that the temperature thereof may decrease stepwise, the wire bonding is performed with the inner leads 2a being pressed by the frame holding member 6d, and also in cooling the matrix frame 2 after wire bonding, the cooling is performed with the inner leads 2a being pressed by the frame holding member 6d as it is. Thus, the occurrence of thermal shrinkage (vibration) in the matrix frame 2 can be reduced further.

Accordingly, it is preferable that the matrix frame 2 be cooled for several seconds (e.g., approximately 3 to 4 seconds) so that the temperature thereof may decrease stepwise, with the inner leads 2a being pressed by the frame holding member 6d, and thereafter the frame be transported after releasing the frame holding member 6d.

In addition, since other effects obtained by the method of manufacturing a semiconductor device according to the second embodiment are the same as the other effects obtained by the method of manufacturing a semiconductor device according to the first embodiment, the repeated explanation is omitted.

(Third Embodiment)

Figure 24:
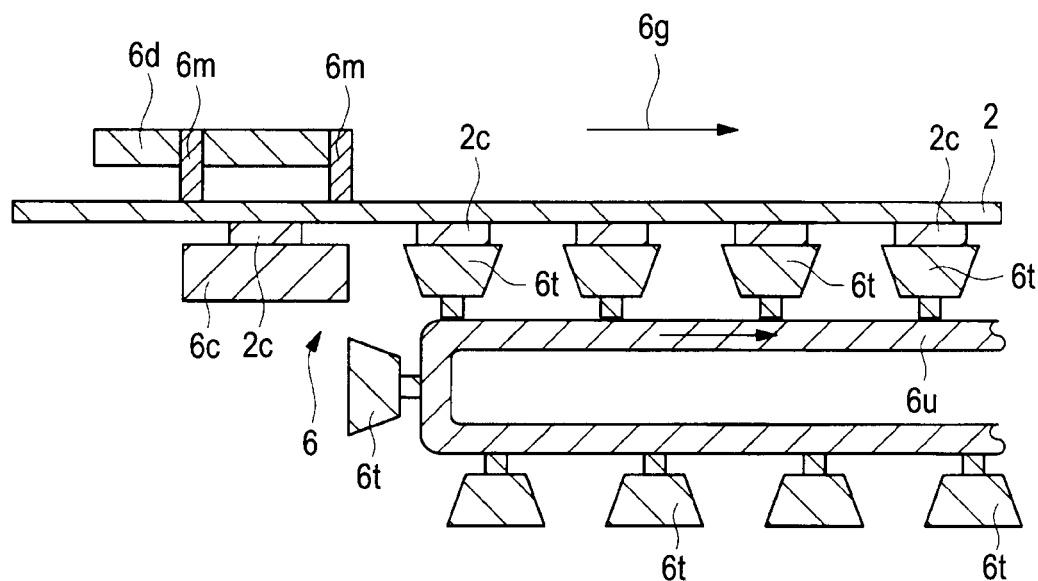
FIG. 24 is a partial sectional view showing an example of the structure of a main part of a wire bonder used in assembling of a semiconductor device according to a third embodiment of the present invention.
Figure 25:
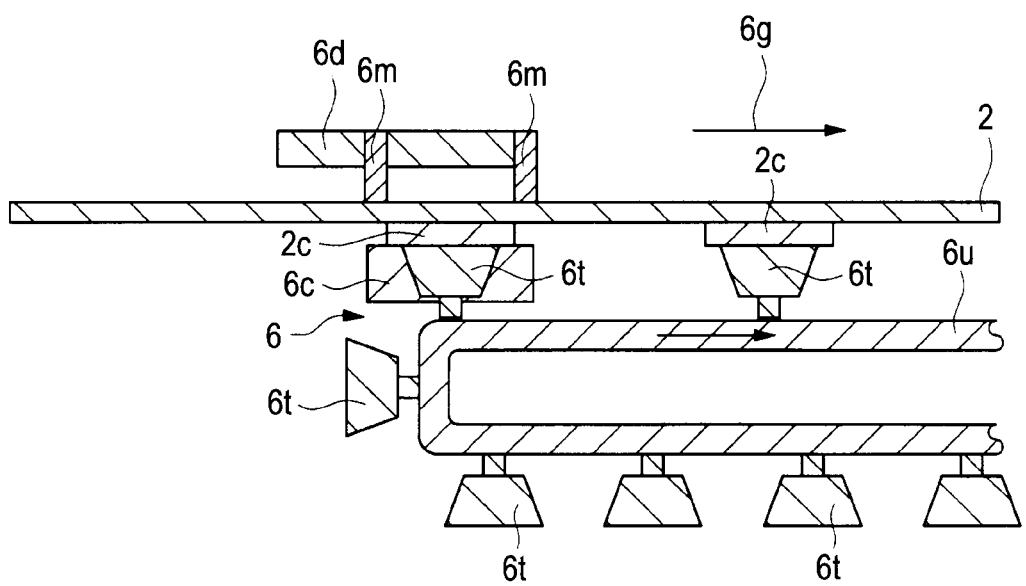
FIG. 25 is a partial sectional view showing a structure of a first modification of the third embodiment of the present invention.

FIG. 24 is a partial sectional view showing an example of the structure of the main part of a wire bonder used in assembling of a semiconductor device according to a third embodiment of the present invention, and FIG. 25 is a partial sectional view showing a structure of a first modification of the third embodiment of the present invention.

According to the embodiment 3, as shown in FIG. 24 and FIG. 25, in the main part of the wire bonder 6, a plurality of suction pads (suction means) 6t capable of sucking and supporting a plurality of tabs (die pads) 2c of the matrix frame 2 are provided on the rear surface side of the matrix frame 2 over the heat block 6b (see FIG. 7).

First, in a structure shown in FIG. 24, the suction pads 6t capable of sucking and supporting these tabs 2c from the rear surface side are provided depending on the arrangement of the tabs 2c of the matrix frame 2, the tabs 2c being arranged in a matrix. The suction pads 6t are held by a pad holder 6u that is provided so as to be movable in the feeding direction 6g, respectively.

This makes it possible to suck and support all the tabs 2c of the matrix frame during wire bonding and after wire bonding, and as a result the vibration of the matrix frame 2 during wire bonding and after wire bonding can be reduced. In particular, since this is a mechanical sucking and supporting operation, the vibration of the matrix frame 2 can be reduced further.

As a result, an improvement in the quality of wire bonding can be achieved.

Furthermore, an improvement in the reliability of wire bonding can be achieved.

In addition, since other effects obtained by the method of manufacturing a semiconductor device according to the third embodiment are the same as the other effects obtained by the method of manufacturing a semiconductor device according to the first embodiment, the repeated explanation is omitted.

Next, FIG. 25 shows the first modification of the third embodiment. A difference from the structure of FIG. 24 lies in the fact that the same suction pad 6t as the suction pad 6t of FIG. 24 is embedded in the platen 6c that supports tab 2c during wire bonding.

Since this makes it possible to suck and support the tab 2c also by the platen 6c, the vibration of the matrix frame 2 can be reduced also in the first frame-transport after releasing the frame holding member 6d.

In addition, since other effects obtained by the first modification of the third embodiment shown in FIG. 25 are the same as the effects obtained by the structure shown in FIG. 24, the repeated explanation is omitted.

The present invention of the present inventors is described specifically as above based on the embodiments. However, it is needless to say that the present invention is not limited to the embodiments of the invention described above, and various modifications are possible without departing from the scope of the invention.

For example, the first to third embodiments described above have been explained with respect to the case of QFP1 in which a semiconductor device is assembled by using a lead frame (matrix frame 2). However, the semiconductor device is not limited to the semiconductor device assembled by using a lead frame, and may be, for example, a BGA (Ball Grid Array) 7 as shown in FIG. 26 that is assembled by using a substrate (wiring substrate) and by being wire bonded.

Figure 26:
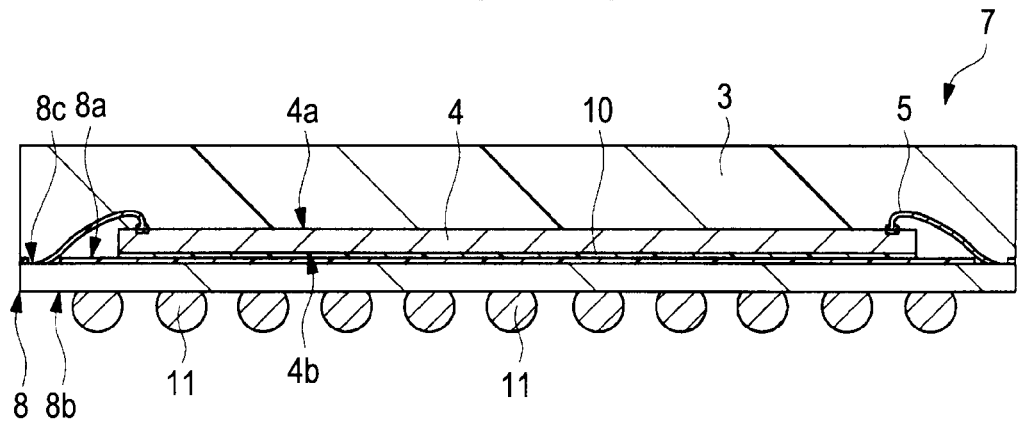
FIG. 26 is a cross sectional view showing an example of the structure of a semiconductor device (BGA) of another embodiment of the present invention.

BGA (semiconductor device) 7 shown in FIG. 26 includes the semiconductor chip 4 that is mounted via a die bonding material such as a resin paste material 10, over a principal surface 8a of a BGA substrate (wiring substrate) 8. Here, surface electrodes of the semiconductor chip 4 are electrically connected to bonding leads 8c of the principal surface 8a of the BGA substrate 8 with a plurality of wires 5. Furthermore, the semiconductor chip 4 and the wires 5 are resin-sealed by the sealing body 3 comprising a sealing resin over the principal surface 8a of the BGA substrate 8.

Moreover, on a rear surface 8b side of the BGA substrate 8, a plurality of solder balls 11 serving as external connection terminals are provided in a grid form (in a lattice form).

Figure 27:
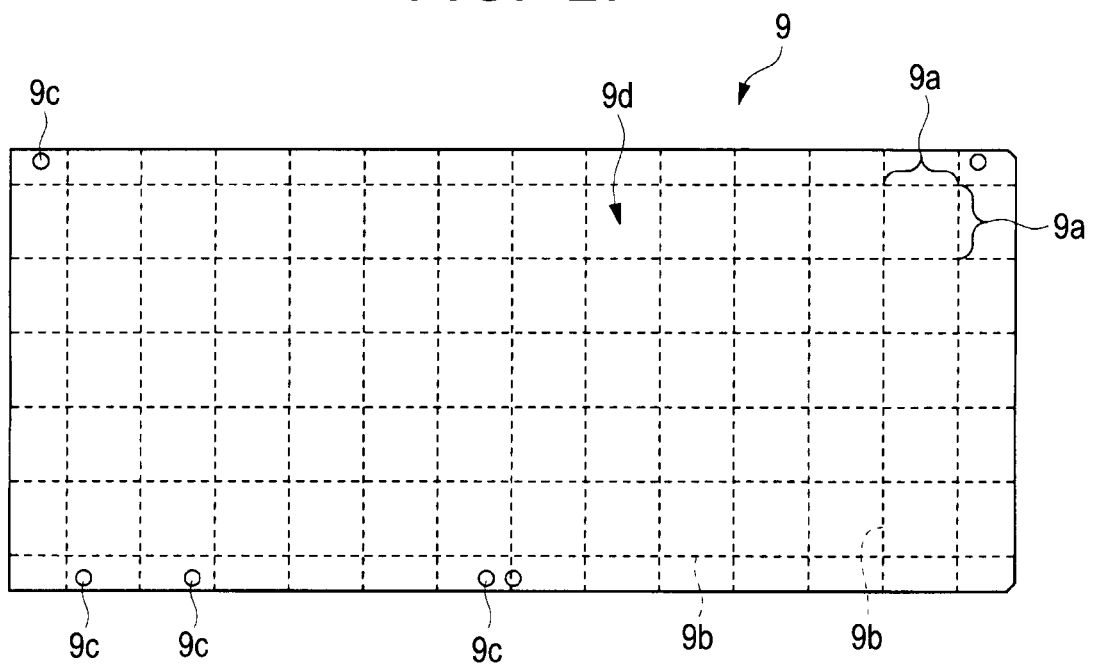
FIG. 27 is a plan view showing an example of the structure of a wiring substrate used in assembling of the semiconductor device shown in FIG. 26.

FIG. 27 shows a structure of a multi-piece substrate (wiring substrate) 9 used in assembling of the BGA 7 having such a structure, wherein in a principal surface 9d thereof, a plurality of device regions 9a, in each of which one BGA 7 is assembled, are formed in a matrix array. The respective device regions 9a are partitioned by dicing lines 9b. Note that, in an outer circumferential portion of the principal surface 9d of the multi-piece substrate 9, there are formed a plurality of through-holes 9c for use in positioning or guiding when transporting the substrate and the like.

Also in BGA 7 assembled by using such a multi-piece substrate 9 and by being wire-bonded, for example, with the use of the cooling method after wire bonding in assembling of a semiconductor device according to the second embodiment, that is, by cooling the multi-piece substrate 9 so that the temperature thereof may decrease stepwise after wire bonding, the vibration of the multi-piece substrate 9 can be reduced and the same effects as those obtained by the second embodiment described above can be obtained.

Moreover, in the first to third embodiments described above, each means for reducing the vibration of the lead frame after wire bonding has been explained independently, but any two or more of these means of the first to third embodiments described above may be combined.

For example, the vibration of the matrix frame 2 after wire bonding can be reduced also by fixing the wire-bonded matrix frame 2 with a holding tool such as the frame holding member 6d, a guide member, a roller means, or an elastic means until cooling is completed.

The present invention is suitable for assembling of electronic devices in which wire bonding is performed.

What is claimed is:

1. A method of manufacturing a semiconductor device, comprising the steps of:
   (a) preparing a lead frame having a first surface, a second surface opposite the first surface, and a plurality of device regions arranged in rows and columns, each device region including a chip mounting portion, a semiconductor chip mounted on the first surface of the chip mounting portion, and a plurality of leads arranged around the chip mounting portion, the plurality of device regions including:
      a first device region located in a first row and a first column,
      a second device region, disposed next to the first device region, located in a second row and the first column,
      a third device region, disposed next to the first device region, located in the first row and a second column, and
   a fourth device region, disposed next to the second and third device regions, located in the second row and the second column; and
   (b) electrically connecting a plurality of metal wires to a plurality of electrode pads of the semiconductor chip and the plurality of leads, respectively, including:
      (b1) disposing the first and second device regions of the lead frame over a heating block,
      (b2) pressing first protruding portions of a frame holding member onto the first surface of the lead frame around the periphery of the first device region, pressing second protruding portions of the frame holding member onto the first surface of the lead frame around the periphery of the second device region, and pressing a first guide portion onto the first surface of the lead frame,
      (b3) during step (b2), electrically connecting the plurality of metal wires to the plurality of electrode pads of the semiconductor chip and the plurality of leads, respectively, of the first and second device regions, and
      (b4) after the step (b3), while the first guide portion is pressing the first surface of the lead frame, releasing the frame holding member from pressing the first surface of the lead frame;
   (c) after the step (b4), feeding the lead frame by one column while the first guide portion is pressing the first surface of the lead frame; and
   (d) after the step (c), electrically connecting a plurality of metal wires to a plurality of electrode pads of the semiconductor chip and the plurality of leads of the third and fourth device regions, respectively, while contacting the heating block to the second surface of the third and fourth device regions of the lead frame, and while pressing the first guide portion onto the first surface of the lead frame in the area between the first and second device regions.

2. The method of manufacturing a semiconductor device according to claim 1, wherein step (d) includes pressing the first guide portion onto the first surface of the lead frame in an area between the third and fourth device regions while electrically connecting the metal wires.

3. The method of manufacturing a semiconductor device according to claim 1, wherein each device region has a single semiconductor chip.

4. A method of manufacturing a semiconductor device, comprising the steps of:
  (a) preparing a lead frame having a first surface, a second surface opposite the first surface, and a plurality of device regions arranged in rows and columns, the plurality of device regions including:
    a first device region located in a first row and a first column,
    a second device region, disposed next to the first device region, located in a second row and the first column,
    a third device region, disposed next to the first device region, located in the first row and a second column, and
    a fourth device region, disposed next to the second and third device regions, located in the second row and the second column,
    wherein each of the plurality of device regions includes a chip mounting portion, a semiconductor chip mounted on the first surface of the chip mounting portion, and a plurality of leads arranged around the chip mounting portion;
  (b) electrically connecting a plurality of metal wires to a plurality of electrode pads of the semiconductor chip and the plurality of leads of the first and second device regions, respectively, while contacting a heating block to the second surface of the first and second device regions of the lead frame, while pressing protruding portions of a frame holding member onto the first surface of the lead frame around each periphery of the first and second device regions, and while pressing a first guide portion onto the first surface of the lead frame;
  (c) after the step (b), releasing the protruding portions of the frame holding member from pressing the first surface of the lead frame;
  (d) after the step (c), feeding the lead frame by one column; and
  (e) after the step (d), electrically connecting a plurality of metal wires to a plurality of electrode pads of the semiconductor chip and the plurality of leads of the third and fourth device regions, respectively, while contacting the heating block to the second surface of the third and fourth device regions of the lead frame, and while pressing the first guide portion onto the first surface of the lead frame in an area between the first and second device regions.

5. The method of manufacturing a semiconductor device according to claim 4,
  wherein the step (b) includes pressing a second guide portion onto the second surface of the lead frame in an area between the first and second device regions.

6. The method of manufacturing a semiconductor device according to claim 5,
  wherein the first guide portion is supported by the frame holding member.

7. The method of manufacturing a semiconductor device according to claim 4,
  wherein the first guide portion extends in a longitudinal direction of the lead frame and is formed in an elongated rod shape.

8. The method of manufacturing a semiconductor device according to claim 7,
  wherein a length of the first guide portion is longer than a length of the lead frame.

9. The method of manufacturing a semiconductor device according to claim 4,
  wherein a diameter of each of the plurality of metal wires is 20 μm or less.

10. The method of manufacturing a semiconductor device according to claim 4,
  wherein, after the step (b) and before the step (d), cooling the lead frame so that the temperature thereof may decrease stepwise by blowing a cooling air to the lead frame.

11. The method of manufacturing a semiconductor device according to claim 4, further comprising;
  (f) after the step (e), sealing the semiconductor chip, the plurality of metal wires, and at least a portion of each of the plurality of leads of each device region, and forming a sealing body over the device regions, and (g) after the step (f), separating the sealed device regions from the lead frame.

12. The method of manufacturing a semiconductor device according to claim 4, wherein step (b) includes pressing the first guide portion onto the first surface in the area between the first and second device regions.

13. The method of manufacturing a semiconductor device according to claim 4, wherein step (e) includes pressing the first guide portion onto the first surface in an area between the third and fourth device regions.

14. The method of manufacturing a semiconductor device according to claim 4,
  wherein step (e) includes pressing the protruding portions of the frame holding member onto a periphery of each of the third and fourth device regions, and not pressing the protruding portion of the frame holding member onto a periphery of each of the first and second device regions.

15. The method of manufacturing a semiconductor device according to claim 4,
  wherein step (e) includes pressing a second guide onto the second surface of the lead frame in the area between the first and second device regions and in the area between the third and fourth device regions.

16. The method of manufacturing a semiconductor device according to claim 4,
  wherein step (e) includes not contacting the heating block to the second surface of the first and second device regions.

17. The method of manufacturing a semiconductor device according to claim 4, wherein each device region has a single semiconductor chip.

18. A method of manufacturing a semiconductor device, comprising the steps of:
  (a) preparing a lead frame having a first surface, a second surface opposite the first surface, and a plurality of device regions arranged in rows and columns, the plurality of device regions including:
    a first device region located in a first row and a first column,
    a second device region, disposed next to the first device region, located in a second row and the first column,
    a third device region, disposed next to the first device region, located in the first row and a second column, and
    a fourth device region, disposed next to the second and third device regions, located in the second row and the second column, wherein each of the plurality of device regions includes a chip mounting portion, a semiconductor chip mounted on the first surface of the chip mounting portion, and a plurality of leads arranged around the chip mounting portion;

(b) electrically connecting a plurality of metal wires to a plurality of electrode pads of the semiconductor chip and the plurality of leads of the first and second device regions, respectively, while contacting a heating block to the second surface of the first and second device regions of the lead frame, while pressing protruding portions of a frame holding member onto the first surface of the lead frame around each periphery of the first and second device regions, and while pressing a first guide onto the first surface of the lead frame;

(c) after the step (b), releasing the protruding portions of the frame holding member from pressing the first surface of the lead frame;

(d) after the step (c), feeding the lead frame by one column; and (e) after the step (d), electrically connecting a plurality of metal wires to a plurality of electrode pads of the semiconductor chip and the plurality of leads of the third and fourth device regions, respectively, while contacting the heating block to the second surface of the third and fourth device regions of the lead frame, while pressing the first guide onto the first surface of the lead frame in the area between the first and second device regions, and while pressing a second guide onto the second surface of the lead frame in the area between the first and second device regions.

19. The method of manufacturing a semiconductor device according to claim 18, wherein each device region has a single semiconductor chip.

* * * * *